United States Patent
Suh et al.

(10) Patent No.: US 9,965,352 B2
(45) Date of Patent: *May 8, 2018

(54) SEPARATE LINK AND ARRAY ERROR CORRECTION IN A MEMORY SYSTEM

(71) Applicant: QUALCOMM Incorporated, San Diego, CA (US)

(72) Inventors: Jungwon Suh, San Diego, CA (US); David Ian West, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 15/151,329

(22) Filed: May 10, 2016

(65) Prior Publication Data
US 2017/0147432 A1    May 25, 2017

Related U.S. Application Data

(60) Provisional application No. 62/258,219, filed on Nov. 20, 2015.

(51) Int. Cl.
*G06F 11/10* (2006.01)
*G06F 3/06* (2006.01)
*G11C 29/52* (2006.01)

(52) U.S. Cl.
CPC .......... *G06F 11/1068* (2013.01); *G06F 3/064* (2013.01); *G06F 3/0619* (2013.01); *G06F 3/0679* (2013.01); *G06F 11/1048* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 7,558,887 B2 | 7/2009 | Gower et al. | |
| 8,082,482 B2 * | 12/2011 | Gower | G06F 11/1008 365/201 |
| 9,183,078 B1 * | 11/2015 | Zhu | G06F 11/10 |
| 2008/0005646 A1 * | 1/2008 | Bains | G06F 11/1008 714/781 |
| 2008/0201626 A1 * | 8/2008 | Sturm | G06F 11/1052 714/763 |
| 2010/0269021 A1 | 10/2010 | Gower et al. | |

(Continued)

FOREIGN PATENT DOCUMENTS

WO    2011160957 A1    12/2011

OTHER PUBLICATIONS

International Search Report and Written Opinion—PCT/US2016/054175—ISA/EPO—dated Dec. 16, 2016.

*Primary Examiner* — Mujtaba M Chaudry
(74) *Attorney, Agent, or Firm* — Qualcomm Incorporated/Seyfarth Shaw LLP

(57) ABSTRACT

A memory device may include link error correction code (ECC) decoder and correction circuitry. The ECC decoder and correction circuitry may be arranged in a write path and configured for link error detection and correction of write data received over a data link. The memory device may also include memory ECC encoder circuitry. The memory ECC encoder circuitry may be arranged in the write path and configured for memory protection of the write data during storage in a memory array.

23 Claims, 13 Drawing Sheets

(56) References Cited

U.S. PATENT DOCUMENTS

| | | | |
|---|---|---|---|
| 2011/0041005 A1* | 2/2011 | Selinger | G06F 11/10 |
| | | | 714/719 |
| 2011/0225475 A1* | 9/2011 | Kumar | G06F 11/1052 |
| | | | 714/763 |
| 2014/0156924 A1* | 6/2014 | Jeon | G11C 5/148 |
| | | | 711/108 |
| 2014/0177362 A1 | 6/2014 | O'Connor et al. | |
| 2015/0089316 A1* | 3/2015 | Zhang | H03M 13/2942 |
| | | | 714/755 |
| 2015/0121171 A1* | 4/2015 | Minzoni | G06F 11/1048 |
| | | | 714/766 |
| 2017/0004035 A1 | 1/2017 | Suh et al. | |
| 2017/0147431 A1 | 5/2017 | West et al. | |

* cited by examiner

FIG. 3B

| | 64-bit Data with 8-bit ECC Parity bits — 410 | | | | | | | | 64-bit Data with 8-bit ECC Parity bits — 420 | | | | | | | |
|---|---|---|---|---|---|---|---|---|---|---|---|---|---|---|---|---|
| | ← Burst Data (Burst Length = 16) → | | | | | | | | | | | | | | | |
| DQ0 | D0 | D8 | E0 | D24 | D32 | D40 | D48 | D56 | D64 | D72 | D80 | D88 | D96 | D104 | D112 | D120 |
| DQ1 | D1 | D9 | E1 | D25 | D33 | D41 | D49 | D57 | D65 | D73 | D81 | D89 | D97 | D105 | D113 | D121 |
| DQ2 | D2 | D10 | E2 | D26 | D34 | D42 | D50 | D58 | D66 | D74 | D82 | D91 | D98 | D106 | D114 | D122 |
| DQ3 | D3 | D11 | E3 | D27 | D35 | D43 | D51 | D59 | D67 | D75 | D83 | D91 | D99 | D107 | D115 | D123 |
| DQ4 | D4 | D12 | E4 | D28 | D36 | D44 | D52 | D60 | D68 | D76 | D84 | D92 | D100 | D108 | D116 | D124 |
| DQ5 | D5 | D13 | E5 | D29 | D37 | D45 | D53 | D61 | D69 | D77 | D85 | D93 | D101 | D109 | D117 | D125 |
| DQ6 | D6 | D14 | E6 | D30 | D38 | D46 | D54 | D62 | D70 | D78 | D86 | D94 | D102 | D110 | D118 | D123 |
| DQ7 | D7 | D15 | E7 | D31 | D39 | D47 | D55 | D63 | D71 | D79 | D87 | D95 | D103 | D111 | D119 | D127 |
| DM0 | L | L | H | L | H | L | L | L | E8 | E9 | E10 | E11 | E12 | E13 | E14 | 15 |

412 — (E0–E7, H column); 424 — (E8–E14, 15); 430 — overall; 420 — right block; 410 — left block

*FIG. 4B*

SEPARATE LINK AND ARRAY ERROR CORRECTION IN A MEMORY SYSTEM

CROSS-REFERENCE TO RELATED APPLICATION

This application claims the benefit under 35 U.S.C. § 119(e) to U.S. Provisional Patent Application No. 62/258,219, entitled "SEPARATE LINK AND ARRAY ERROR CORRECTION IN A MEMORY SYSTEM," filed on Nov. 20, 2015, the disclosure of which is expressly incorporated by reference herein in its entirety.

BACKGROUND

Field

The present disclosure generally relates to integrated circuits (ICs). More specifically, one aspect of the present disclosure relates to separate memory array and link error correction in a low power memory sub-system.

Background

Semiconductor memory devices include, for example, static random access memory (SRAM) and dynamic random access memory (DRAM). A DRAM memory cell generally includes one transistor and one capacitor, which enables a high degree of integration. The capacitor can be either charged or discharged to store information as a corresponding bit value (e.g., '0' or '1'). Because capacitors leak charge, the stored information eventually fades unless the capacitor charge is refreshed periodically. Due to the refresh requirement, DRAM is referred to as dynamic memory as opposed to SRAM and other static memory. The continuous refreshing of DRAM generally limits its use to computer main memory.

DRAM scaling continues to increase the total number of bits for each DRAM chip. Unfortunately, DRAM scaling increases the number of weak retention cells (e.g., cells that have a reduced retention time). Such cells involve additional refresh cycles to maintain the stored information. Advanced DRAM processes may suffer additional random bit refresh errors within a memory cell array due to the additional refresh cycles or other process variations. Some low power memories implement error correction codes (ECCs) to improve memory yield and reliability by applying ECCs to any random bit error in the memory cell array. ECC decoding and error correction, however, degrades memory performance due to an increased read access time. In addition, a memory link (e.g., interface) is not protected by the ECCs, and the overall memory reliability is insufficient for meeting high reliability and high performance system memory requirements.

SUMMARY

A memory device may include link error correction code (ECC) decoder and correction circuitry. The ECC decoder and correction circuitry may be arranged in a write path and configured for link error detection and correction of write data received over a data link. The memory device may also include memory ECC encoder circuitry. The memory ECC encoder circuitry may be arranged in the write path and configured for memory protection of the write data during storage in a memory array.

A method of memory cell array and link error correction in a low power memory sub-system may include reading link error correction code (ECC) parity bits. The method may also include verifying received write data according to the link ECC parity bits. The method may further include communicating the verified write data to memory ECC encoder circuitry configured for memory protection of the recovered write data within a memory array according to memory ECC parity bits.

A memory sub-system may include a memory controller having an error correction code (ECC) encoder/decoder. The memory sub-system may also include a memory device coupled to the memory controller via at least a data link. The memory device may include link ECC decoder and correction circuitry. The link ECC decoder and correction circuitry may be arranged in a write path and configured for detection and correction of link errors during transmission of write data over the data link. The memory device may include memory ECC encoder circuitry. The memory ECC encoder circuitry may be arranged in the write path and configured for memory protection of the write data during storage within a memory array according to memory ECC parity bits.

A memory device may include means for detecting and correcting link errors of write data received over a data link within a write path of the memory device. The memory device may also include means for protecting the write data during storage in a memory array within the write path of the memory device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 3A and 3B are timing diagrams illustrating communication of parity bits during a normal or masked write command according to aspects of the disclosure.

FIGS. 4A to 4C are timing diagrams illustrating various options for transferring error correction code (ECC) parity bits between a host system on chip (SoC) and low power memory devices during a mask write (MWT) command according to aspects of the present disclosure.

DETAILED DESCRIPTION

Figure 1:
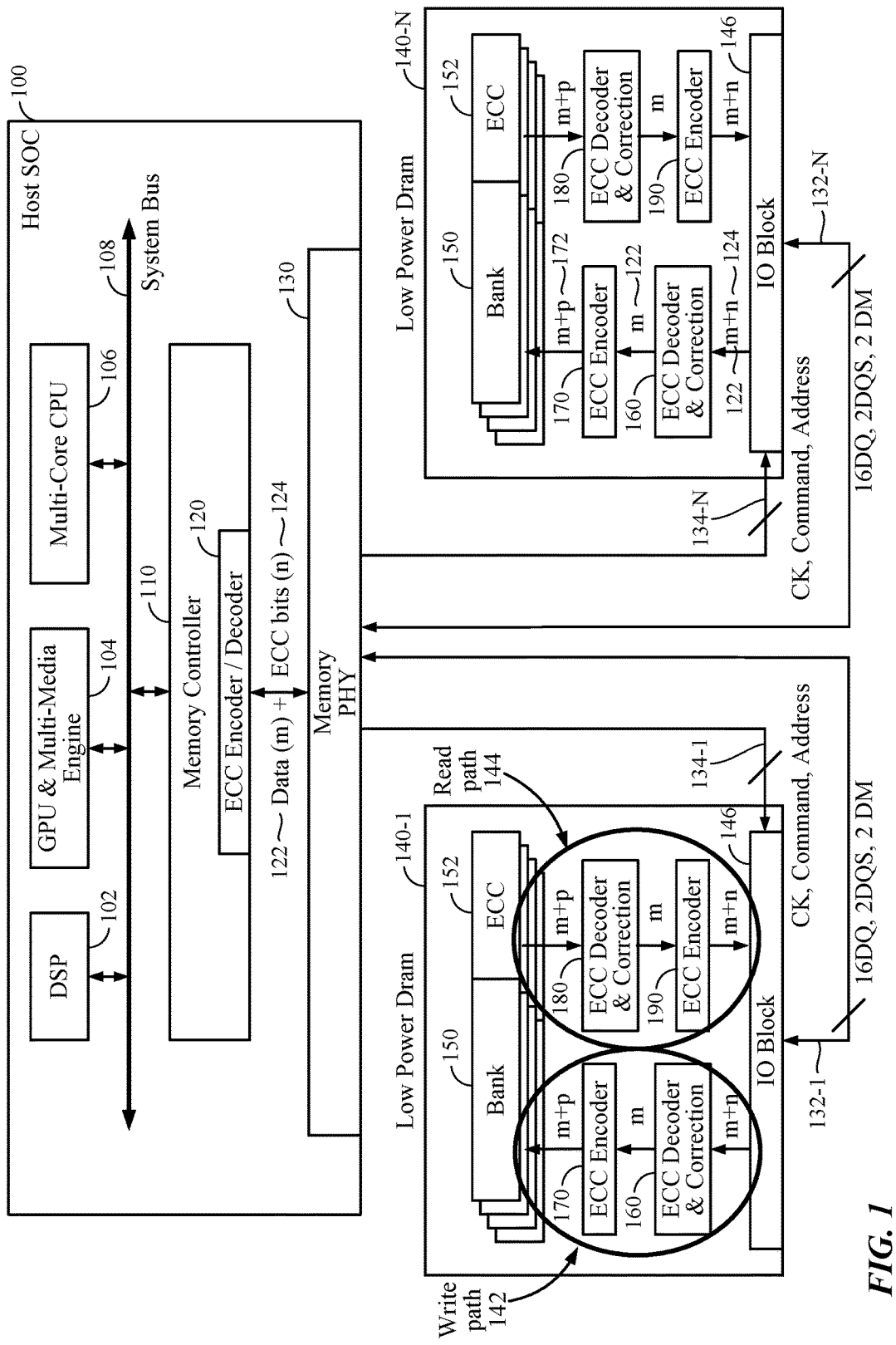
FIG. 1 shows a top view of a low power memory sub-system illustrating a host system on chip (SoC) communicably coupled to low power memory devices in accordance with aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor memory devices include, for example, static random access memory (SRAM) and dynamic random access memory (DRAM). A DRAM memory cell generally includes one transistor and one capacitor, which enables a high degree of integration. The capacitor can be either charged or discharged to store information as a corresponding bit value (e.g., '0' or '1'). Because capacitors leak charge, the stored information eventually fades unless the capacitor charge is refreshed periodically. Due to the refresh requirement, DRAM is referred to as dynamic memory as opposed to SRAM and other static memory. The continuous refreshing of DRAM generally limits DRAM to being used as computer main memory.

DRAM scaling continues to increase the total number of bits for each DRAM chip. Unfortunately, DRAM scaling increases the number of weak retention cells (e.g., cells that have a reduced retention time). Such cells involve additional refresh cycles to maintain the stored information. Advanced DRAM processes may suffer additional random bit refresh errors within a memory cell array due to the additional refresh cycles or other process variations. Some low power memories implement error correction codes (ECCs) to improve memory yield and reliability by applying ECCs to any random bit errors in the memory cell array.

For example, server and computing systems can use a wide (e.g., 72-bit input/output (IO) width) memory module to enhance reliability of a memory link and a memory cell array. Because memory failure within a server computing system is intolerable, reliability of the memory link is enhanced by applying ECCs to memory operations. Storage of the ECCs, however, involves an additional device. For example, in a 72-bit IO width memory module, an 8-bit ECC is assigned to each 64-bit data block of eight memory devices. Assigning an 8-bit ECC to each 64-bit data block provides protection against bit errors in both the memory interface and the memory cell array.

In the 72-bit IO width memory module, however, a ninth 64-bit (ECC) memory device is used to store the eight 8-bit ECCs assigned to each 64-bit data block of the eight memory devices. Unfortunately, this memory configuration increases memory system cost and memory power. In particular, this memory configuration involves additional printed circuit board (PCB) area and cost for supporting a wider memory channel due to the ECC memory device. The ECC memory device also involves standby and active power, which increases the cost associated with this memory configuration.

One technique for protecting both a memory array and link includes the transfer of ECC bits between a host (e.g., a system on chip (SoC)) and low power memories. The ECC bits may be transferred by extending a data burst length (e.g., a 16-bit burst length extended to an 18-bit burst length). Unfortunately, the extended burst length causes significant memory performance loss by reducing net memory bandwidth. Some low power memories implement ECCs to improve memory yield and reliability by applying ECCs to any random bit error in the memory cell array. ECC decoding and error correction within the memory device, however, degrade memory performance due to an increased read access time. In addition, a memory link (e.g., interface) is not protected by the ECCs, and the overall memory reliability is insufficient for meeting high reliability and high performance system memory specifications.

Aspects of the disclosure relate to a memory sub-system including a host system on chip (SoC) and multiple memory devices. The memory controller includes an error correction code (ECC) encoding and decoding block to generate link ECC bits for protecting write data against memory link errors and to correct any data failure caused by the memory link and/or a memory array of a memory device. The memory devices each have a cell array for data and an ECC array for memory ECC parity bits. In aspects of the present disclosure, link ECC parity bits are generated to protect read/write data against link errors during transmission over a memory link (e.g., a parallel bus structure), and memory ECC parity bits are generated to protect write data within the memory devices against random bit errors within the memory arrays of the memory devices. In some aspects of the disclosure, the memory ECC parity bits are generated based on a proprietary methodology of the memory device manufacturer different from a non-proprietary methodology of the host SoC used to generate the link ECC parity bits.

The link ECC parity bits from the memory controller may be transferred between a host and the memory devices through a data mask pin or a data byte associated with a mask write (MWT) command. The location of the link ECC parity bits may be communicated to the memory devices using link ECC bit location information. This process does not involve memory bandwidth loss or a memory interface change in the memory sub-system. In the case of a mask write operation, a memory device recovers the link ECC parity bits associated with the first asserted data mask (DM) bit (e.g., "H"), in which the mask write command bit fields indicate DM activity for an "m" bit data pattern. In the case of a normal write operation, the memory device recovers the link ECC bits from the DM data stream.

In a read operation, the memory controller may recover memory/link ECC parity bits within the DM data stream from the memory device. When the command/address (CA) bus is shared between multiple memory devices, the mask write command may include additional bit field (EL) information indicating where the ECC byte is embedded in the DM data stream. In one configuration, a host program writes a DQ byte ID to a mode register in each memory device during initialization. The memory device option (to determine byte ID/order) may be hard-wired at a package level. If "m"=128, then "n" is equal to or less than 16. In this aspect of the disclosure, the mask write command is followed by a link ECC location command (e.g., EL bits) to indicate where the link ECC code is embedded in a write data burst.

FIG. 1 shows a top view of a low power memory sub-system illustrating a host system on chip (SoC) 100 coupled to memory devices 140 (140-1, ..., 140-N) in accordance with aspects of the present disclosure. This aspect of the present disclosure applies link error correction code (ECC) parity bits to a low power memory sub-system in mobile or computing systems to protect the memory link (e.g., a parallel bus structure) from random bit errors. More specifically, aspects of the present disclosure may relate to next generation low power double data rate (DDR) specifications (e.g., low power double data rate 4 (LPDDR4)) and memory controller implementations in mobile or computing system chipsets, in which the memory devices use proprietary memory ECC parity bits to protect the memory cell arrays from random bit errors.

Representatively, the host SoC 100 includes various processing units that support multi-threaded operation. For the configuration shown in FIG. 1, the host SoC 100 includes a digital signal processor (DSP) 102, a graphics processor unit (GPU) and multi-media engine 104, a multi-core central processing unit (CPU) 106, a system bus 108, a memory controller 110, and a memory physical layer (PHY) 130. The DSP 102, the GPU and multi-media engine 104, and the multi-core CPU 106 support various functions such as video, audio, graphics, gaming, and the like. Each processor core of the multi-core CPU 106 may be a reduced instruction set computing (RISC) machine, a microprocessor, or some other type of processor.

In this aspect of the disclosure, the host SoC 100 is communicably coupled to memory devices 140 (e.g., low power dynamic random access memory (DRAM)) through the memory PHY 130. In this configuration, the memory controller 110 includes ECC encoder/decoder circuitry 120 to generate link ECC parity bits 124 for data 122 (e.g., read/write data) that is communicated to one of the memory devices 140 through the memory PHY 130 along a data link 132 (132-1, ..., 132-N) and a command/address bus 134 (134-1, ..., 134-N), which may be collectively referred to as the memory link. The link ECC parity bits 124 generated by the ECC encoder/decoder circuitry 120 enable correction of any data failure caused by the memory link (e.g., data link 132) at the memory devices 140.

As the host SoC 100 increases the memory link serial data rate from, for example, thirty-two hundred (3200) megabits per second (Mbps) to sixty-four hundred (6400) Mbps, protection against memory link errors becomes more of a concern. In this configuration, the link ECC parity bits 124 ("n" bit ECC) are generated by the memory controller 110 to protect the data 122 (e.g., "m" bit write) from random bit errors during transmission over the data link 132. Because both the link ECC parity bits 124 and the data 122 are transferred between the host SoC 100 and the memory devices 140 during write and read operations, any memory link errors can be detected and corrected with the link ECC parity bits 124. Also, any random bit error during transmission from the memory cell arrays 150 can be corrected in the ECC encoder/decoder circuitry 120 of the memory controller 110.

In this configuration, the memory devices 140 include the memory cell arrays 150 (e.g., memory banks) for storing the data 122 and the ECC arrays 152 for storing memory ECC parity bits. In this aspect of the present disclosure, the memory devices 140 include memory ECC encoder circuitry 170 that is configured to generate memory ECC parity bits 172 to enable detection and correction of any random bit errors caused by the memory cell arrays 150 of the memory devices 140 during storage of the data 122. The data 122 is stored in one of the memory cell arrays 150 (e.g., memory banks), and the memory ECC parity bits 172 are stored in the ECC arrays 152. Also, any random bit error in the memory cell arrays 150 can be corrected in the memory ECC decoder and correction circuitry 180 of the memory devices 140 based on a proprietary algorithm of the memory device manufacturer different from a non-proprietary algorithm of the host SoC 100 used to generate the link ECC parity bits 124. Although described as proprietary and non-proprietary algorithms for the array and link, respectively, the present disclosure contemplates any combination of proprietary and non-proprietary algorithms.

The link ECC parity bits 124 from the memory controller 110 may be received by the memory devices 140 through a data mask pin for a data byte associated with a mask write command. The location of the link ECC parity bits 124 may be communicated to the memory devices 140 using ECC bit location (EL) information. This process is performed during a mask write (MWT) operation, in which the memory devices 140 recover the link ECC parity bits 124 when a first data mask (DM) bit is asserted (e.g., "H") and the MWT command bit fields indicate DM activity in accordance with the data 122. During a normal write operation, the memory devices 140 may recover the link ECC parity bits 124 from a DM data stream.

In this configuration, the memory devices 140 include an input/output (TO) block 146 that is communicably coupled to the data link 132 and the command/address bus 134. In operation, the link ECC parity bits 124 generated by the memory controller 110 according to a non-proprietary methodology of the host SoC 100 may be used by a link ECC decoder and correction circuitry 160 of the memory devices 140 to detect and correct link errors within the data 122. That is, the link ECC decoder and correction circuitry 160 enables the memory devices 140 to perform memory link error correction. In this aspect of the present disclosure, the memory devices 140 include memory ECC encoder circuitry 170 that is configured to generate memory ECC parity bits 172 to enable detection and correction of any random bit errors during storage of the data 122. Accordingly, once the data 122 is corrected and/or verified, memory ECC parity bits 172 are generated within the memory ECC encoder circuitry 170 along a write path 142 of the memory devices 140 to protect the data 122 against random bit error during storage.

During operation, the data 122 is stored in one of the memory cell arrays 150 (e.g., memory banks), and the memory ECC parity bits 172 are stored in the ECC arrays 152. In this configuration, any random bit error in the memory cell arrays 150 can be corrected in the memory ECC decoder and correction circuitry 180 of the memory devices 140 based on a proprietary algorithm of the memory device manufacturer using the memory ECC parity bits 172 stored within the ECC arrays 152. Accordingly, once the data 122 is corrected and/or verified, link ECC parity bits 124 are generated within the link ECC encoder circuitry 190 along the read path 144 of the memory devices 140 to protect the data 122 against random bit error during transmission over the data link 132.

In this aspect of the disclosure, the host SoC 100 is able to detect and correct any memory link errors using the link ECC parity bits 124 that may be caused by the increased memory link serial data rate (e.g., from 3200 Mbps to 6400 Mbps). Additionally, any random bit error in the memory cell arrays 150 can be corrected by the memory ECC decoder and correction circuitry 180 of the memory devices 140 using the memory ECC parity bits 172. The use of the memory ECC decoder and correction circuitry 180 and the link ECC encoder circuitry 190 along the read path 144 of the memory devices 140 may lead to undesirable read latency. In one aspect of the present disclosure, the functionality of the memory ECC decoder and correction circuitry 180 and/or the link ECC encoder circuitry 190 are incorporated into the memory controller, for example, as shown in FIG. 2.

Figure 2:
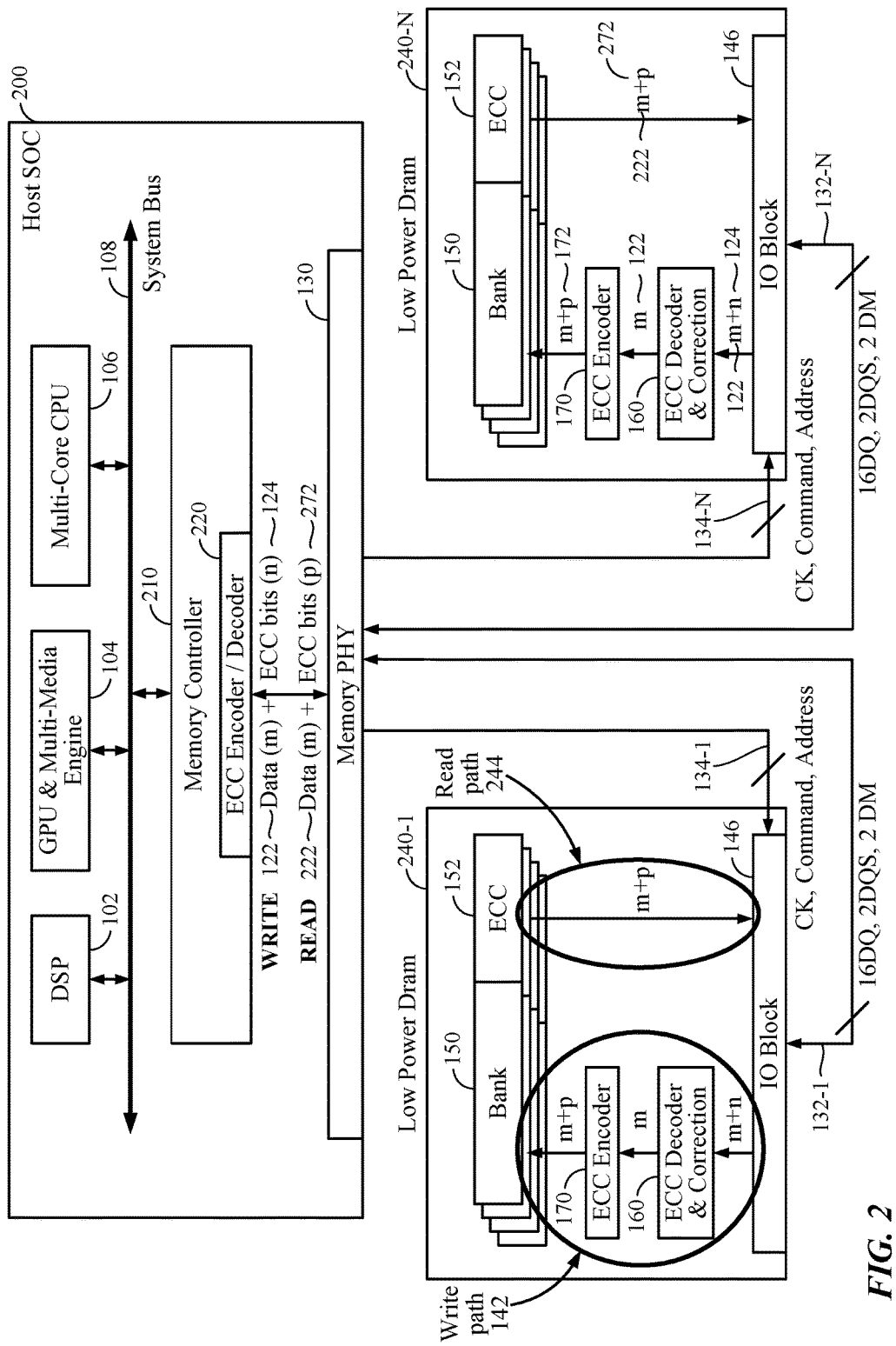
FIG. 2 shows a top view of a low power memory sub-system illustrating a host system on chip (SoC) communicably coupled to low power memory devices in accordance with another aspect of the present disclosure.

FIG. 2 shows a top view of a low power memory sub-system illustrating a host SoC 200 communicably coupled to low power memory devices in accordance with another aspect of the present disclosure. In this aspect of the disclosure, the host SoC 200 is communicably coupled to memory devices 240 through the memory PHY 130. In this configuration, the memory controller 210 includes an ECC encoder/decoder circuitry 220 to generate link ECC parity bits 124 for data 122 (e.g., write data) that is communicated to one of the memory devices 140 through the memory PHY 130 along the memory link including the data link 132 and the command/address bus 134. The link ECC parity bits 124 generated by the ECC encoder/decoder circuitry 220 enable correction of any data failure caused by the memory link (e.g., data link 132) at the memory devices 140.

In this aspect of the present disclosure, the functionality of the memory ECC decoder and correction circuitry 180 and/or the link ECC encoder circuitry 190 are incorporated into the ECC encoder/decoder 220 of the memory controller 210. In this configuration, the write path 142 of the memory devices 240 is unchanged from the configuration shown in FIG. 1. The read path 244 of the memory devices 240, however, omits the use of the memory ECC decoder and correction circuitry 180 and the link ECC encoder circuitry 190 of the memory devices 140 of FIG. 1 to avoid undesirable read latency. Instead, the ECC encoder/decoder 220 of the memory controller 210 is modified to detect and correct either a link error (e.g., during transmission over a parallel bus structure) or a memory error (e.g., during storage within one of the memory cell arrays 150) of read data 222 (e.g., data read from a memory cell array) using memory ECC parity bits.

In this aspect of the disclosure, read data latency is recognized as one of the key parameters in determining memory system performance. Accordingly, the proprietary methodology of the memory device manufacturer used to generate the memory ECC parity bits 172 is shared with the host SoC manufacturer in the interest of reducing read latency. In this aspect of the present disclosure, the memory controller 210 provides dual ECC support to eliminate memory ECC detection and correction within the memory devices 240. During the read operation, the read data 222 and the memory ECC parity bits 272 read out from one of the memory cell arrays 150 are directly transferred to the memory controller 210 and memory ECC detection and correction is performed by the memory controller 210. By skipping the ECC decoding and correction procedure within the memory devices 240, read latencies are improved. As an alternative to providing the proprietary algorithm, the memory device manufacturer can provide a decoding algorithm that also accounts for the link encoding in combination with the memory array encoding. In this case, the proprietary algorithm is not disclosed and can remain proprietary.

Referring again to FIG. 1, in the memory devices 140, an entire memory line (e.g., a 256-bit word) is generally read from the memory array during a write operation. During a mask write operation, the memory ECC encoder circuitry 170 executes a read-modify-write operation within one of the memory cell arrays 150 to perform ECC encoding with read and write data (masked data bytes are replaced with the corresponding data bytes in one of the memory cell arrays 150). That is, the mask write operation enables updating of selected bytes of the memory line, such that the masked data bytes are not written to the memory cell arrays 150. In operation, an extra pin (e.g., a data mask bit) is sent along with the data 122 to remove designated write data and limit the read-modify-write operation by designating the write data bytes that are ignored.

Figure 3A:
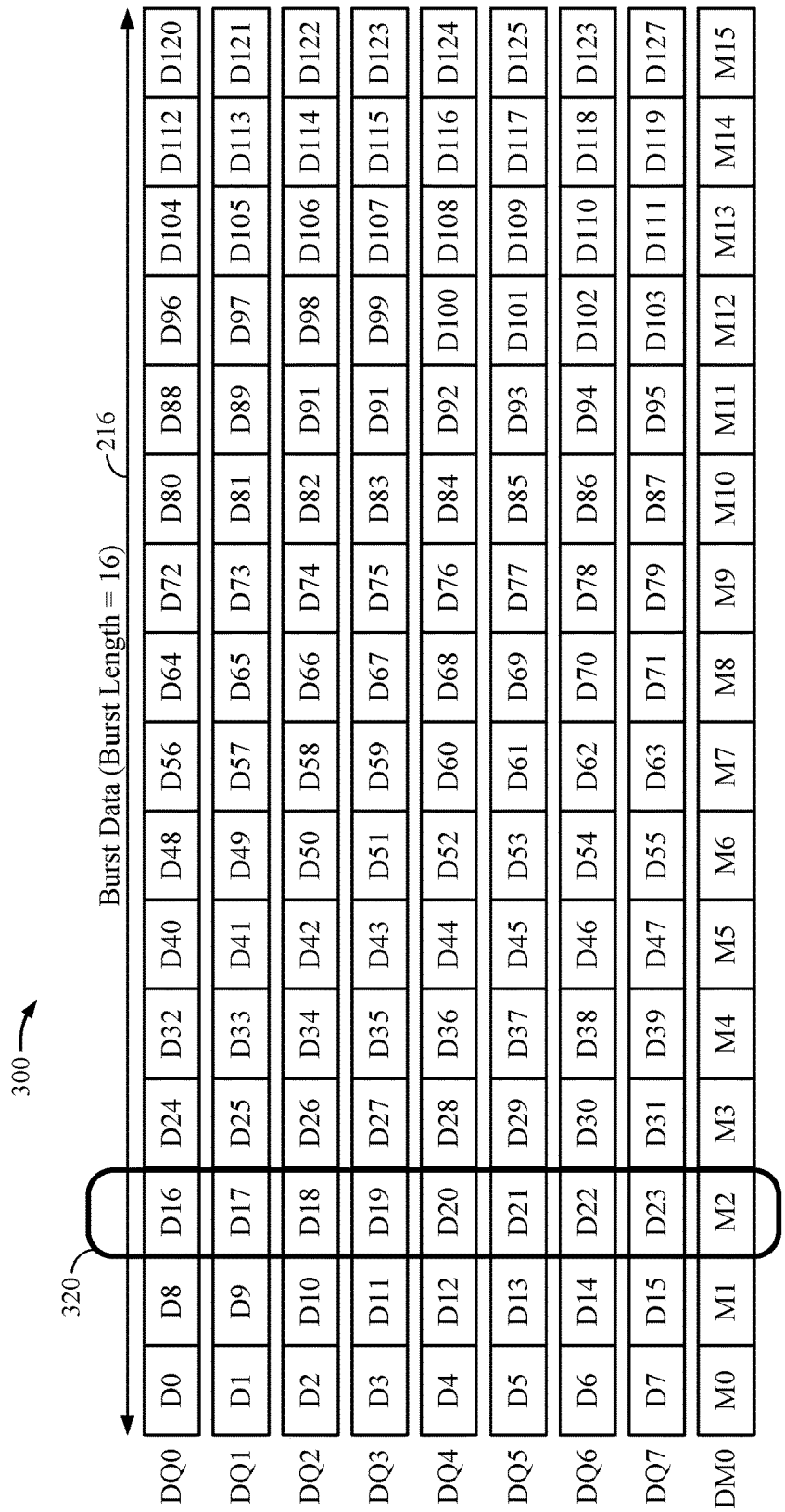

FIG. 3A is a timing diagram 300 illustrating a mask write (MWT) command for, for example, a 128-bit write data having an associated 16-bit data mask with a burst length equal to 16. In the timing diagram 300, "D" refers to write data; and "M" refers to data mask bits, with one data mask bit assigned for each DQ byte. In this example, the M2 bit of the DM0 pin associated with write data D<16:23> is asserted (e.g., "High" or "H"). As a result, mask write data 320 (e.g., write data D<16:23>) is not written to a target one of the memory cell arrays 150 (FIG. 1). In response to the mask write command, the target one of the memory devices 140 executes a read operation from one of the memory cell arrays 150 and replaces the mask write data 320 with read data Q<16:23> to form the write data (e.g., 128-bit write data) for memory ECC encoding using the memory ECC encoder circuitry 170. The memory ECC encoder circuitry 170 stores the 128-bit write data within the target one of the memory cell arrays 150 and memory ECC parity bits 172 are written to a target one of the ECC arrays 152.

In aspects of the present disclosure, link ECC parity bits 124 from the memory controller 110 are transferred between the host SoC 100 and the memory devices through a data mask pin or a data byte associated with a mask write command. The location of the link ECC parity bits 124 may be communicated to the memory devices 140 using ECC bit location information. In the case of a mask write operation, the memory devices 140 recover the link ECC parity bits 124 associated with the first asserted data mask (DM) bit (e.g., "H"), in which the mask write command bit fields indicate DM activity for each "m" bit data pattern. In case of a normal write operation, the memory devices 140 recover the link ECC parity bits 124 from the DM data stream.

Figure 3B:
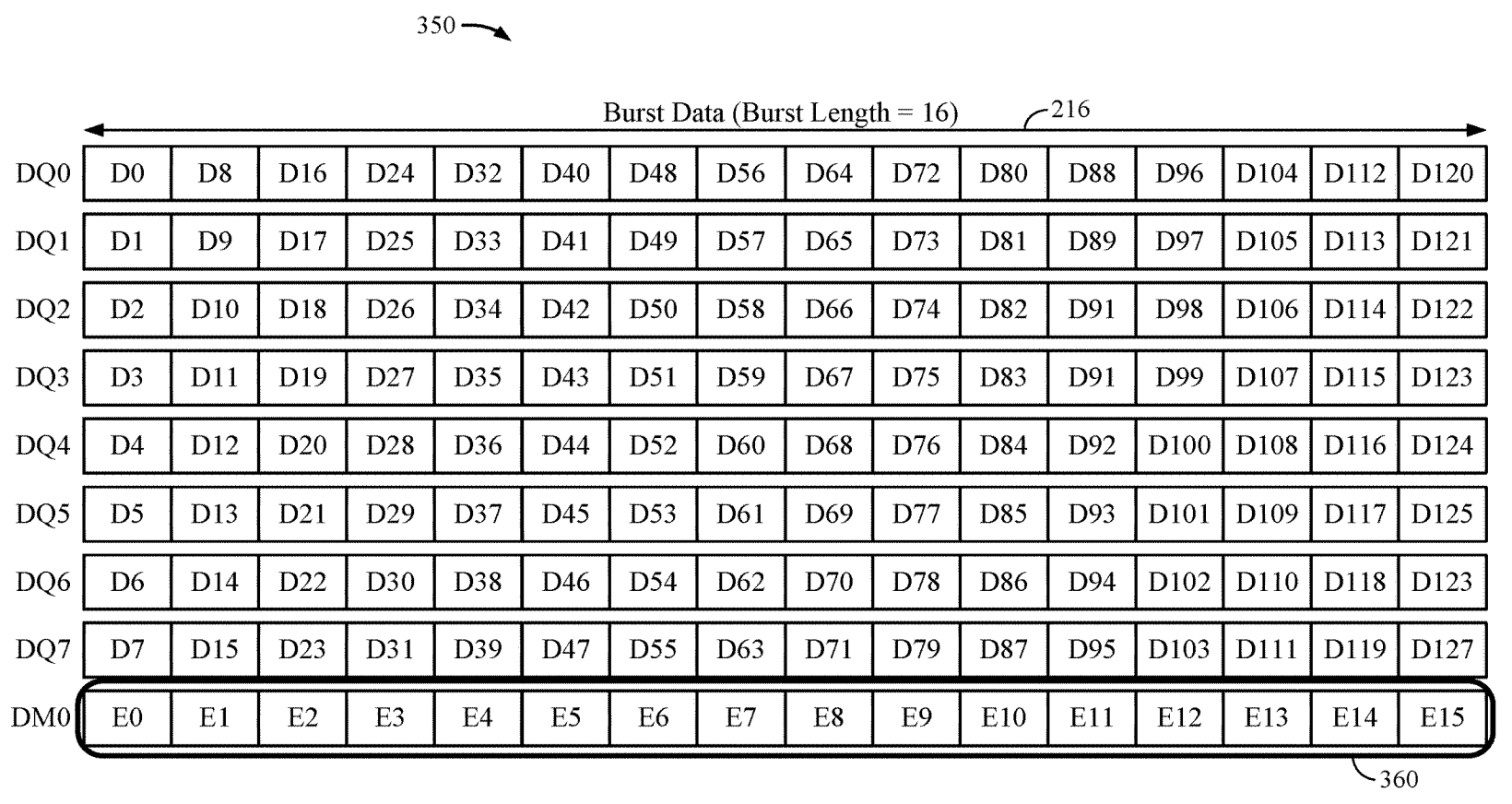

FIG. 3B is a timing diagram 350 illustrating a normal write command for, for example, 128-bit write data having an associated 16-bit data mask with a burst length equal to 16. Low power memory devices, such as the memory devices 140 (FIG. 1), have a normal write command separate from a mask write command. For a normal write command, all bits of the DM0 pin (E0, . . . , E15) associated with the 128-bit write data are de-asserted (e.g., "Low"). By contrast, for a mask write command, at least one DM bit is asserted "High" during a burst data stream (BL). As a result, the bits of the DM0 pin are unused during normal write commands. In this example of a normal write command, the link ECC parity bits (E0, . . . , E15) are transferred to the memory devices 140 through the unused DM bits 360 in which "E" represents a link ECC parity bit. As a result, the memory devices 140 can recognize the link ECC parity bits 124 generated by the memory controller 110 through the DM pin.

During a mask write command, however, the DM pin is not available for carrying the link ECC parity bits 124. In aspects of the present disclosure, the link ECC parity bits 124 from the memory controller 110 are transferred between the host SoC 100 and the memory devices 140 through a mask write data byte associated with a mask write command. The location of the link ECC parity bits 124 may be communicated to the memory devices 140 using ECC bit location information. The memory devices 140 may recover ECC bits associated with the first asserted data mask (DM) bit (e.g., "H"), in which the mask write command bit fields indicate DM activity for each "m" bit data pattern. In case of a normal write operation, the memory devices recover the ECC bits from the DM data stream. In addition, during a read operation, the link ECC parity bits 124 or the memory ECC parity bits 172 are communicated through the DM pin.

In aspects of the present disclosure, a total of 16 link ECC parity bits may be available from a 128-bit data chunk (e.g., DQ byte X 16 data beats). In an alternative implementation, the 16 data beats of link ECC parity bits per 128-bit data chunk may contain more than link ECC parity bits. For example, the 16 data beats may include an 8-bit link ECC plus data bus inversion (DBI) bits and other like bits.

Figure 4A:
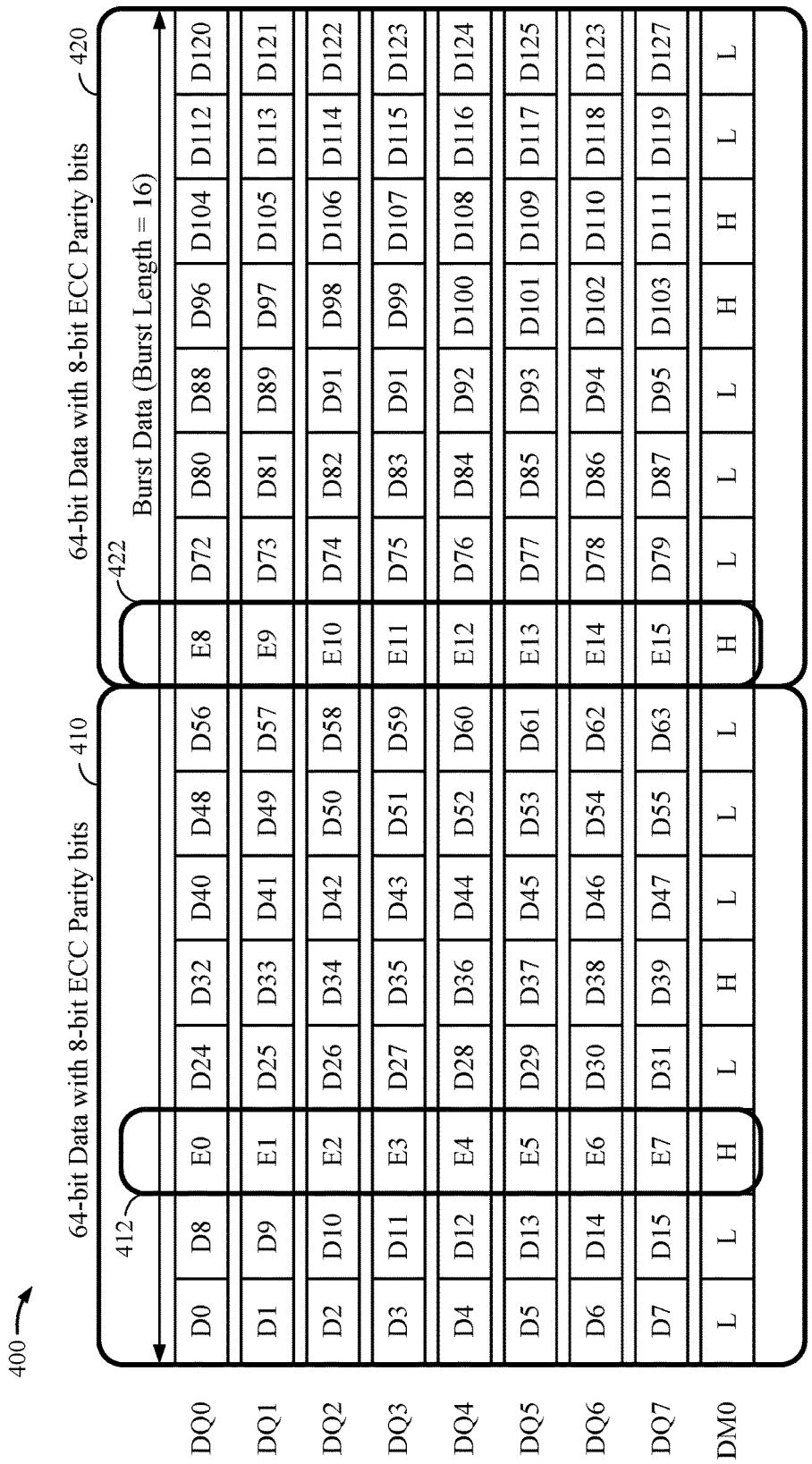
Figure 4C:
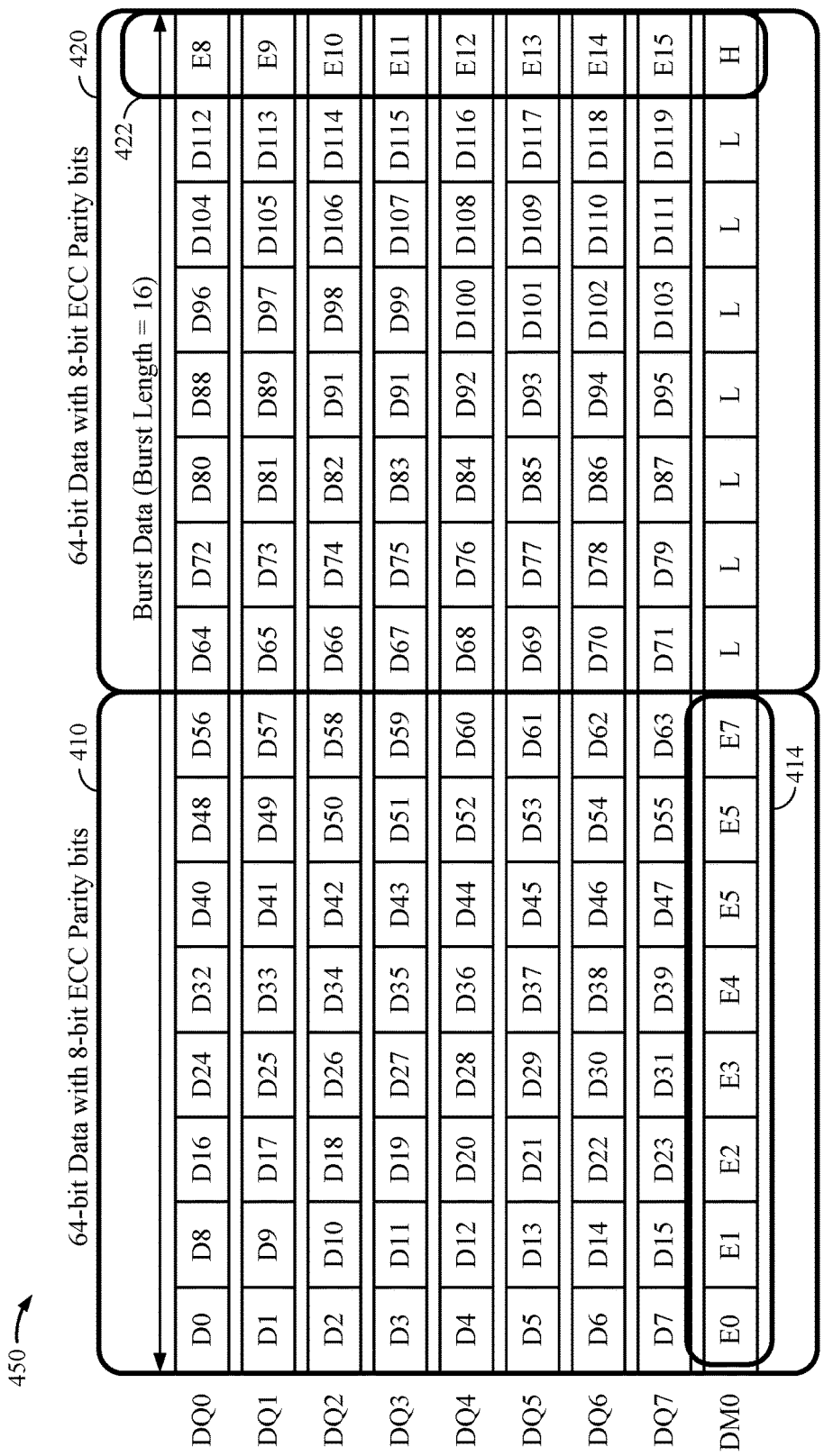

FIGS. 4A to 4C are timing diagrams illustrating various options for transferring the link ECC parity bits 124 between the host SoC 100 and the memory devices 140 during a mask write command according to aspects of the present disclosure. Communication of the link ECC parity bits 124 and/or the memory ECC parity bits 172 from the memory device 140/240 to the host SoC 100/200 are communicated through the mask write data 320, which is used during a read operation.

FIG. 4A is a timing diagram 400 illustrating a mask write command for, for example, 128-bit write data having an associated 16-bit data mask with a burst length equal to 16. In this arrangement, the 128-bit write data is separated into first write data 410 and second write data 420 (e.g., a first 64-bit data portion with first 8-bit link ECC parity bits and a second 64-bit data portion with second 8-bit link ECC parity bits). As noted, for a mask write command, at least one data mask bit (DM0) is asserted "H" during a burst data stream (e.g., having a 64-bit burst length). In this example, a first 8-bit link ECC (e.g., E0, . . . , E7) is embedded within a first mask write data byte 412 (e.g., D<16:23>). In addition, a second 8-bit link ECC (e.g., E8, . . . , E15) is embedded within a second mask write data byte 422 (e.g., D<64:71>).

FIG. 4B is a timing diagram 430 illustrating a mask write operation for the first write data 410 combined with a normal write operation for the second write data 420. In this arrangement, a first 8-bit link ECC (e.g., E0, . . . , E7) is embedded within a first mask write data byte 412 (e.g., D<16:23>). In the second write data 420, the bits of the DM0 pin are unused for the normal write operation. In this example, the second 8-bit link ECC (e.g., E8, . . . , E15) is transferred to the memory devices 140 through second unused DM bits 424. As a result, the memory devices can recognize the link ECC parity bits 124 generated by the memory controller 110 through the first mask write data byte 412 for the first write data 410 and the second unused DM bits 424 for the second write data 420. In this aspect of the present disclosure, the host SoC 100 issues a mask write command having an extended bit field to indicate where the ECC byte is embedded; namely, the mask write data byte or the unused DM bits depending on the data mask activity.

FIG. 4C is a timing diagram 450 illustrating a normal write operation for the first write data 410 combined with a mask write operation for the second write data 420. In this arrangement, the bits of the DM0 pin are unused for the normal write operation. In this example, the first 8-bit link ECC (e.g., E0, . . . , E8) is transferred to the memory devices 140 through first unused DM bits 414. In the second write data 420, the second 8-bit link ECC (e.g., E8, . . . , E15) is embedded within a second mask write data byte 422 (e.g., D<120:127>). As a result, the memory devices can recognize the link ECC parity bits 124 generated by the memory controller 110 through the first unused DM bits 414 for the first write data 410 and the second mask write data byte 422 for the second write data 420. In this aspect of the present disclosure, the host SoC 100 also issues a mask write command having an extended bit field to indicate where ECC information is embedded; namely, the unused DM bits or the mask write data byte depending on the data mask activity.

Figure 5:
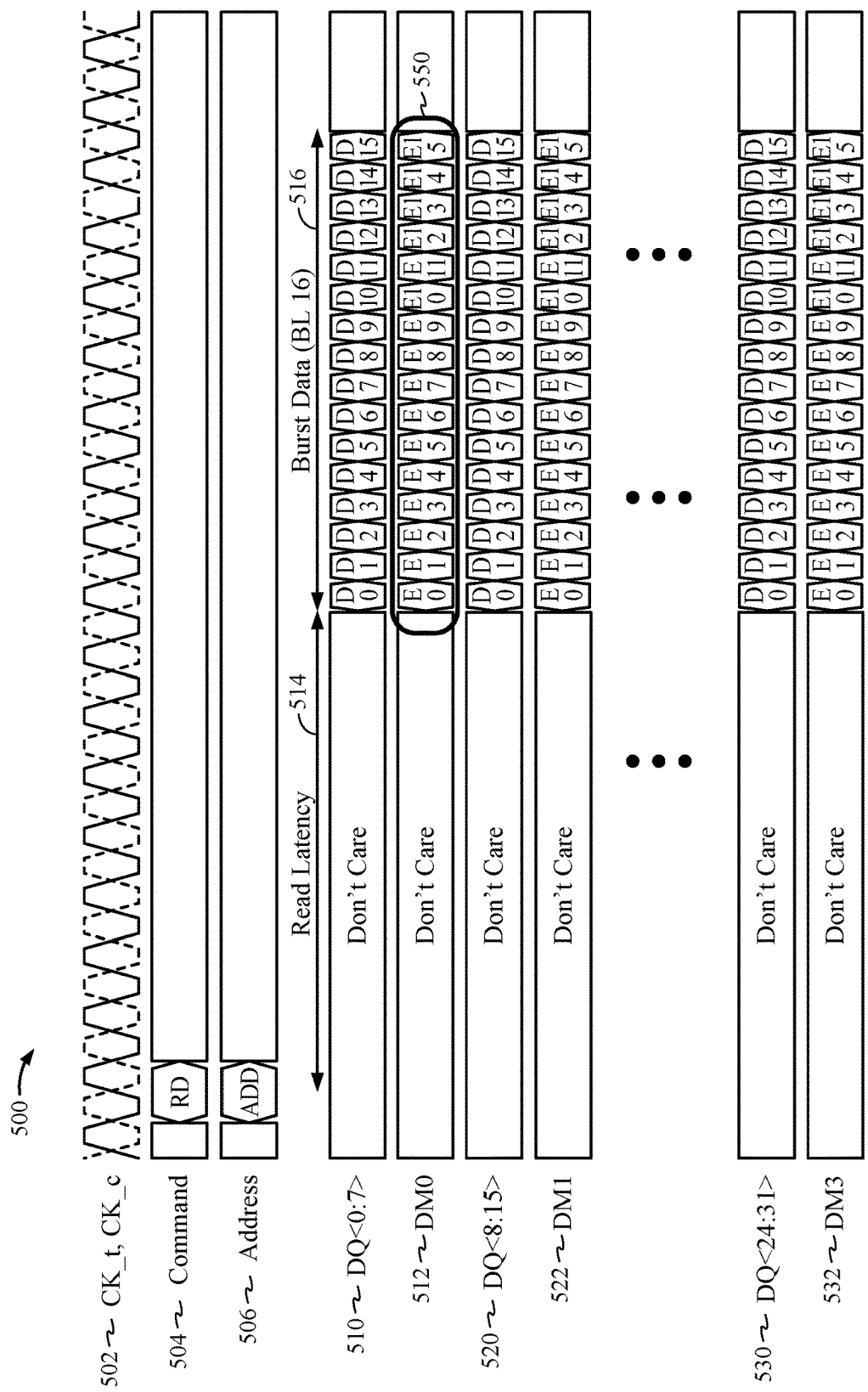
FIG. 5 is a timing diagram illustrating communication of error correction code (ECC) parity bits during a read (RD) command within a bus according to aspects of the present disclosure.

FIG. 5 is a timing diagram 500 illustrating communication of link/memory ECC parity bits during a read (RD) command within, for example, a bus having a 128-bit input/output bus width according to aspects of the present disclosure. The timing diagram 500 shows a clock signal 502, a command signal 504 and an address signal 506. The timing diagram 500 also shows a first data signal 510 and an associated first data mask signal 512 having an associated read latency 514 and burst data 516. For a read (RD) command, 128-bit read data and a 16-bit link/memory ECC (e.g., E0, . . . , E15) for each DQ byte (e.g., D0, . . . , D15) are transferred to the host SoC 100 from the memory cell arrays 150 using unused DM bits 550.

In one aspect of the disclosure, a memory link error during a read operation can be detected and corrected in the ECC encoder/decoder circuitry 120 of the memory controller 110 using the link ECC parity bits 124 from the unused DM bits 550 according to the low power memory sub-system configuration shown in FIG. 1. Alternatively, a random bit error of the read data within the memory cell array and/or a link error may be detected using the memory ECC parity bits 272 according to the low power memory sub-system configuration shown in FIG. 2. A second data signal 520 and an associated second data mask signal 522 as well as a fourth data signal 530 and an associated fourth data mask signal 532 are also shown.

Figure 6:
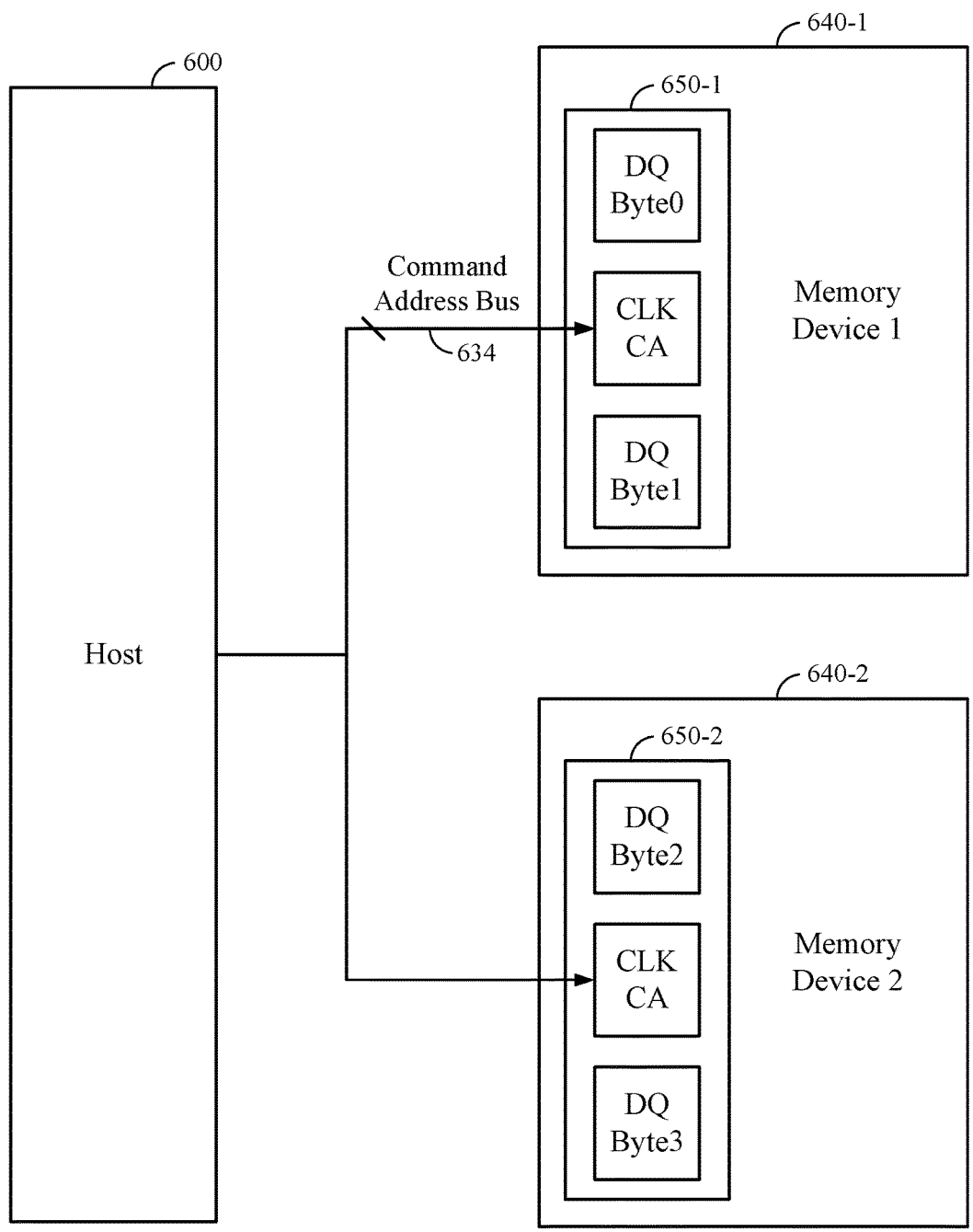
FIG. 6 shows a top view of a low power memory sub-system illustrating a host system on chip (SoC) communicably coupled to memory devices using a shared command/address in accordance with aspects of the present disclosure.

FIG. 6 shows a top view of a low power memory sub-system illustrating a host system on chip (SoC) 600 communicably coupled to memory devices 640 (640-1, 640-2) through a shared command/address bus 634 in accordance with aspects of the present disclosure. During a read operation, the link ECC parity bits 124 and/or the memory ECC parity bits 272 may be recovered using the unused DM bits 550 (see FIG. 5) from the memory devices 640. In this arrangement, however, the shared command/address bus 634 is provided between the host SoC 600 and the memory devices 640. In configurations using the shared command/address bus 634, a mask write command may include an additional bit field (EL) indicating whether the link ECC parity bits 124 or the memory ECC parity bits 272 are embedded in data or data mask bit stream.

In this aspect of the present disclosure in which the shared command/address bus 634 supports multiple devices, the host may program a Byte ID to each device to distinguish EL information. This programming may be performed by using either a package option or mode register set (MRS) programming. For example, when using the shared command/address bus 634, the host SOC 600 programs a Byte ID to each of the memory devices 640 (e.g., "L" to one of the memory devices 640-1 and "H" to one of the memory devices 640-2, then one of the memory devices 640-1 is assigned EL<0:3> and one of the memory devices 640-2 is assigned EL<4:7>). Alternatively, the functionality is provide at the package level in which a device ID pin is tied to "Ground" for one of the memory devices 640-1 and a "Power (logic high)" for one of the memory devices 640-2.

Figure 7:
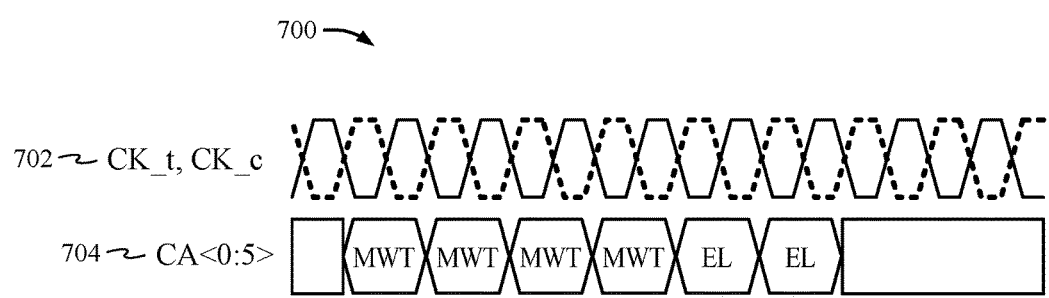
FIG. 7 shows a timing diagram for communicating error correction code (ECC) location information during a mask write (MWT) command according to aspects of the present disclosure.

For example, FIG. 7 shows a timing diagram 700 for communicating an ECC location during a mask write command according to aspects of the present disclosure. The timing diagram 700 shows a clock signal 702, and a command/address signal 704. In this aspect of the disclosure, the mask write (MW) command is followed by an ECC location command (e.g., EL bits) to indicate where the link ECC parity bits 124 are embedded in the data 122 or the memory ECC parity bits 272 in the read data 222. In an alternative configuration, the host SoC 600 program writes a DQ byte ID (identification) to a mode register 650 (650-1, 650-2) in each of the memory devices 640 during initialization, as shown in FIG. 6. The memory device option (to determine byte ID/order) may also be hard-wired at a package level.

Figure 8A:
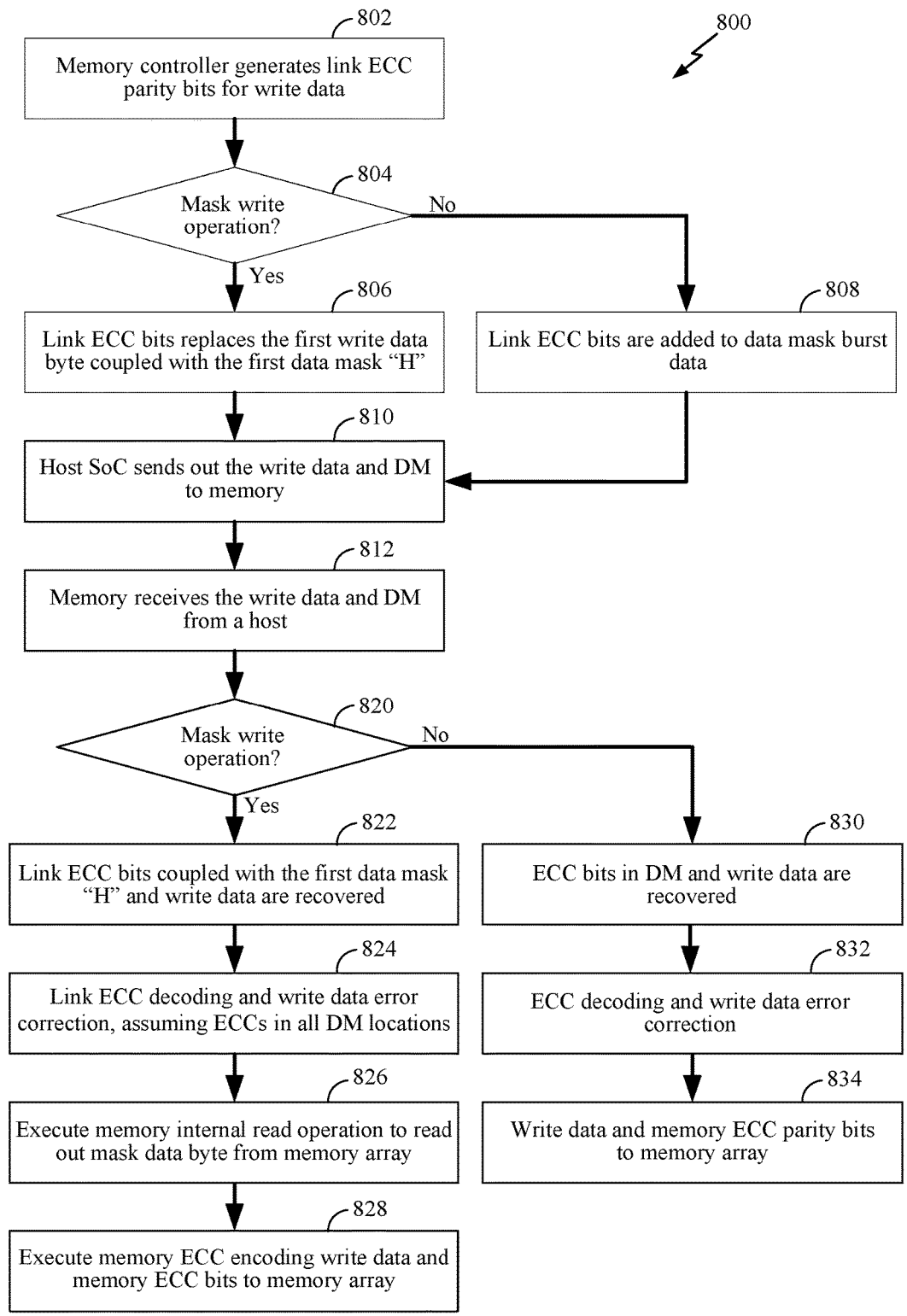
FIGS. 8A and 8B are flow diagrams illustrating methods for communication of link/memory error correction code (ECC) parity bits during a mask write (MWT) command, a normal write command and a read (RD) command according to aspects of the disclosure.

FIG. 8A is a flow diagram illustrating a method of memory cell array and link error correction in a low power memory sub-system according to aspects of the disclosure. The method 800 begins at block 802 in which a memory controller generates link ECC parity bits for write data (e.g., 8-bit ECC parity bits for 64-bit write data). At block 804, it is determined whether a mask write operation is being performed. When a normal write operation is being performed, the link ECC parity bits are added to the data mask burst data, at block 808. For example, as shown in FIG. 3B, the link ECC parity bits (E0, . . . , E15) are transferred to the memory devices 140 through the unused DM pins (e.g., the 320. For a mask write command, the link ECC parity bits replace the first mask write data byte associated with a first asserted data mask bit, at block 806. For example, as shown in FIG. 4A, a first 8-bit link ECC (e.g., E0, . . . , E7) is embedded within a first mask write data byte 412 (e.g., D<16:23>).

Referring again to FIG. 8A, at block 810 the host (e.g., SoC) sends out the write data and the data mask to a target memory device. At block 812, the target memory device receives the write data and the data mask from the host. At block 820, it is determined whether a mask write operation is being performed. When a normal write operation is being performed, process blocks 830 to 834 execute to complete the normal write command. For a mask write command, process blocks 822 to 828 execute to complete the mask write command. In this aspect of the present disclosure, the memory devices 140/240 may be configured for reading link error correction code (ECC) parity bits within unused data mask bits during a normal write operation or within a mask write data byte corresponding to an asserted data mask bit during a mask write operation.

Figure 8B:
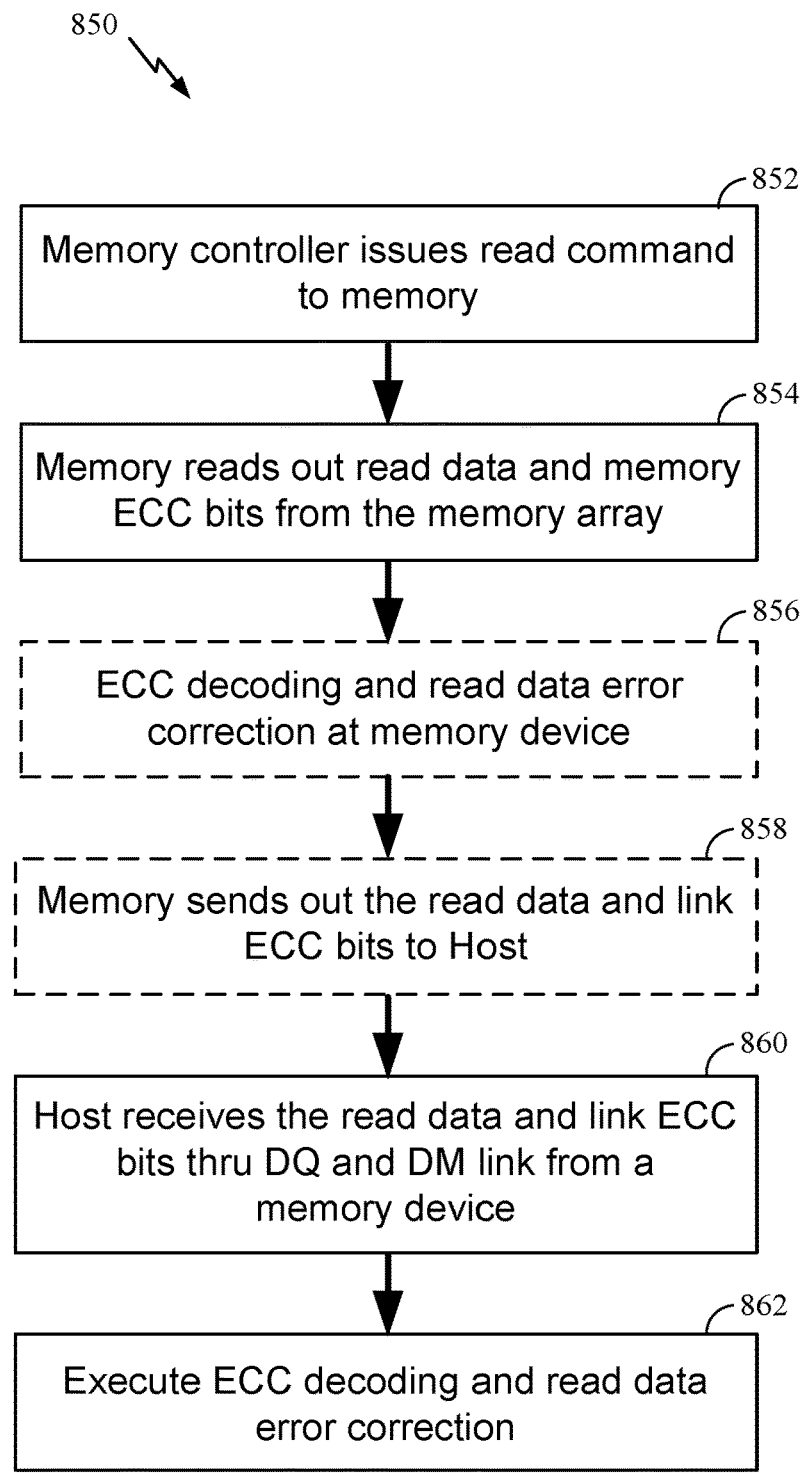

FIG. 8B is a flow diagram illustrating a method 850 for a read operation in a low power memory sub-system according to aspects of the disclosure. At block 852, a memory controller issues a read command to a target memory device. At block 854, the target memory device reads the read data from a memory cell array and memory ECC bits from an ECC array. In the read operation, optionally, blocks 856 and 858 for memory ECC decoding and read data error correction may be skipped to simplify memory implementation and to accelerate a read speed (e.g., lower read latency from read command) because the memory controller can recover the bit error caused in the memory cell array using an ECC encoder/decoder at blocks 860 and 862. It is a trade-off between memory performance (latency) and memory sub-system reliability (memory cell array bit error+read link error).

In one configuration, a low power memory sub-system includes means for reading link ECC parity bits from unused data mask bits during a normal write operation or from a mask write data byte corresponding to an asserted data mask bit during a mask write operation of received write data. The low power memory sub-system also includes means for detecting and correcting link errors of the write data during transmission over the data link according to the link ECC parity bits. The low power memory sub-system also includes means for generating link ECC parity bits to protect the read data during transmission over the data link. The low power memory sub-system also includes means for embedding the link ECC parity bits within data mask bits during transmission of the read data over the data link.

In one aspect of the disclosure, the reading means is the input/output (IO) block 146 of FIGS. 1 and 2, configured to perform the functions recited by the reading means. In one aspect of the disclosure, the detecting and correcting means is the link ECC decoder and correction circuitry 160 of FIGS. 1 and 2, configured to perform the functions recited by the detecting and correcting means. The generating means may be the link ECC encoder circuitry 190 and the embedding means may be the input/output (IO) block 146 of FIG. 1 configured to embed link ECC parity bits. In another aspect, the aforementioned means may be a device or any layer configured to perform the functions recited by the aforementioned means.

Aspects of the disclosure relate to a memory sub-system including a host system on chip (SoC) and multiple memories. The memory controller has an error correction code (ECC) encoding and decoding block to generate link ECC bits for write data and to correct any data failure caused by the memory link and/or a memory core array. The memory has a cell array for data and an ECC array for memory ECC parity bits. The link ECC parity bits from the memory controller are transferred between a host and memories through a data mask pin or a data byte associated with a mask write (MWT) command. The location of the link ECC parity bits may be communicated to the memory devices using ECC bit location information. This process does not involve memory bandwidth loss or a memory interface change in the memory sub-system. In the case of a mask write operation, the memory devices recover the link ECC bits associated with the first asserted data mask (DM) bit (e.g., "H"), in which the mask write command bit fields indicate DM activity per "m" bit data pattern. In the case of a normal write operation, the memory devices recover the link ECC bits from the DM data stream.

In one aspect of the disclosure, read data latency is recognized as one of the key parameters in determining memory system performance. Accordingly, the proprietary methodology of the memory device manufacturer used to generate the memory ECC parity bits is shared with the host SoC manufacturer in the interest of reducing read latency. In this aspect of the present disclosure, the memory controller provides dual ECC support to eliminate memory ECC detection and correction within the memory devices. During a read operation, the read data and the memory ECC parity bits read out from one of the memory cell arrays are directly transferred to the memory controller and memory ECC detection and correction is performed by the memory controller. Read latency is, therefore, improved by skipping the ECC decoding and correction procedure within the memory devices.

Figure 9:
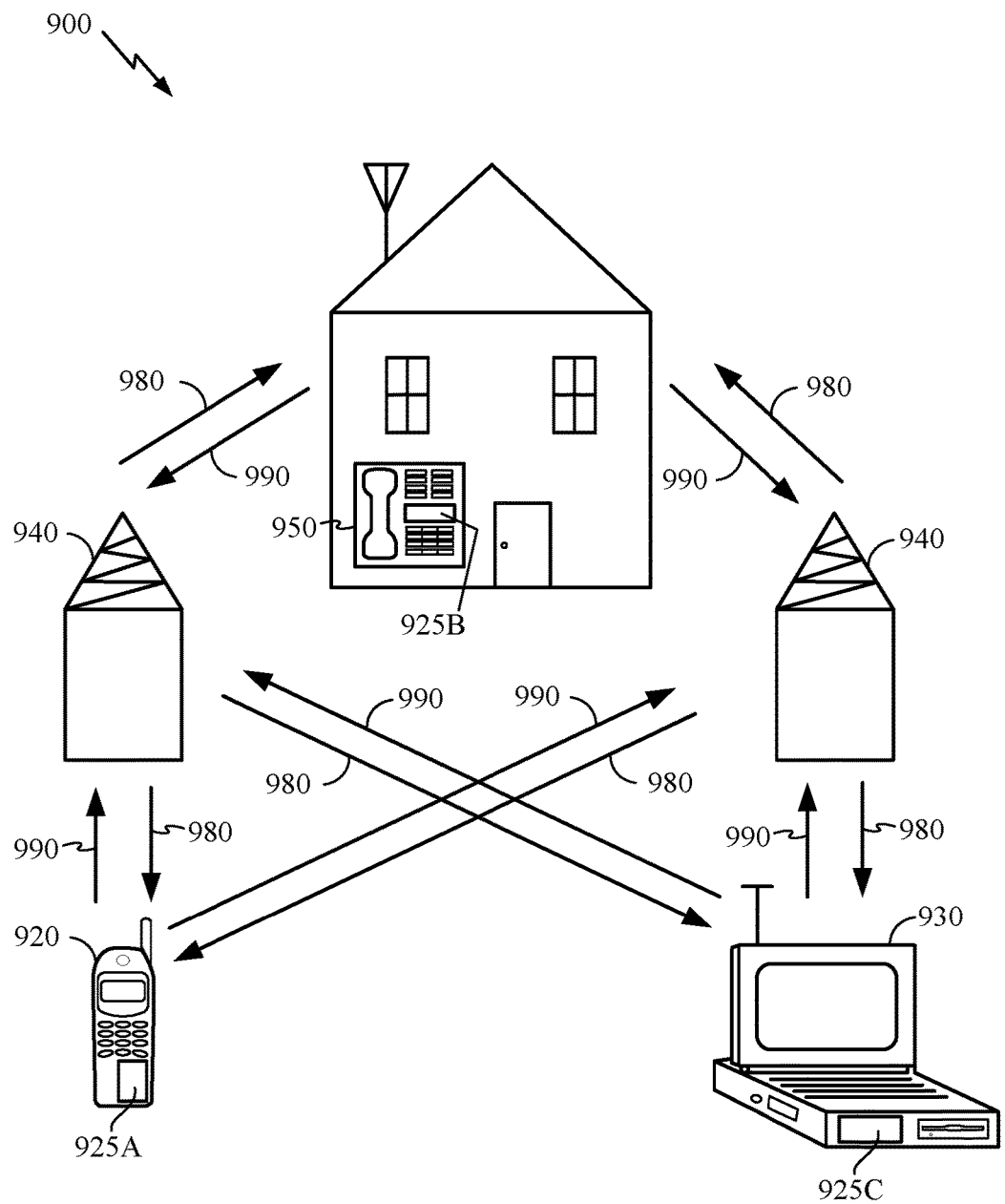
FIG. 9 is a block diagram showing a wireless communication system in which a configuration of the disclosure may be advantageously employed.

FIG. 9 is a block diagram showing an exemplary wireless communication system 900 in which a configuration of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925B, and 925C, which include the disclosed low power memory sub-system. It will be recognized that any device containing an IC may also include the disclosed low power memory sub-system, including the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, a remote unit 920 is shown as a mobile telephone, a remote unit 930 is shown as a portable computer, and a remote unit 950 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, or any other device that stores or retrieves data or computer instructions, or any combination thereof. For example, a remote unit including the low power memory sub-system may be integrated within a vehicle control system, a server computing system or other like system specifying critical data integrity. Although FIG. 9 illustrates IC devices 925A, 925B, and 925C, which include the disclosed a low power memory sub-system, the disclosure is not limited to these exemplary illustrated units. Aspects of the present disclosure may be suitably employed in any device, which includes the low power memory sub-system.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A memory device, comprising:
   a memory array; and
   a write path coupled to the memory array, the write path comprising:
      link error correction code (ECC) decoder and correction circuitry configured for link error detection and correction of write data received over a high speed serial memory link according to link ECC write data parity bits, the link ECC decoder and correction circuitry further configured to read the link ECC write data parity bits from unused data mask bits of the received write data during a normal write operation or from a mask write data byte of the received write data corresponding to an asserted data mask bit during a mask write operation of the received write data, and
      memory ECC encoder circuitry configured for memory protection of the received write data during storage in the memory array.

2. The memory device of claim 1, in which the memory ECC encoder circuitry generates memory ECC parity bits to protect the received write data during storage within the memory array.

3. The memory device of claim 1, further comprising:
   a read path coupled to the memory array, the read path comprising:
      memory ECC decoder and correction circuitry configured for memory error detection and correction of data read from the memory array, and
      link ECC encoder circuitry configured for link protection of the read data from the memory array.

4. The memory device of claim 3, in which the memory ECC decoder and correction circuitry is configured to detect and correct memory errors of the read data from the memory array according to memory ECC parity bits.

5. The memory device of claim 3, in which the link ECC encoder circuitry is further configured to generate link ECC read data parity bits to protect the read data during transmission over the high speed serial memory link.

6. The memory device of claim 5, in which the link ECC encoder circuitry is further configured to embed the link ECC read data parity bits within data mask bits during transmission of the read data received over the high speed serial memory link.

7. The memory device of claim 1 integrated into a mobile phone, a set top box, a music player, a video player, an entertainment unit, a navigation device, a computer, a hand-held personal communication systems (PCS) unit, a portable data unit, a fixed location data unit, a server computing system and/or a vehicle control system.

8. A method of memory cell array and link error correction in a low power memory device, comprising:

receiving, at the low power memory device, write data over a high speed serial memory link from a host system-on-chip (SoC);

reading link error correction code (ECC) parity bits within unused data mask bits of the received write data during a normal write operation or within a mask write data byte of the received write data corresponding to an asserted data mask bit during a mask write operation;

verifying the received write data according to the link ECC parity bits; and communicating, within the low power memory device, the verified write data to memory ECC encoder circuitry configured for memory protection of the recovered write data within a memory array of the low power memory device according to memory ECC parity bits.

9. The method of claim 8, further comprising detecting and correcting of the received write data according to the link ECC parity bits when the write data is corrupted during transmission over the high speed serial memory link.

10. The method of claim 8, further comprising integrating the low power memory sub-system into a mobile phone, a set top box, a music player, a video player, an entertainment unit, a navigation device, a computer, a hand-held personal communication systems (PCS) unit, a portable data unit, a fixed location data unit, a server computing system and/or a vehicle control system.

11. A memory sub-system, comprising:
a memory controller having an error correction code (ECC) encoder/decoder; and
a memory device coupled to the memory controller via at least a high speed serial memory link, the memory device, comprising:
a memory array; and
a write path coupled to the memory array, the write path comprising:
link ECC decoder and correction circuitry configured for detection and correction of link errors during transmission of write data received over the high speed serial memory link according to link ECC write data parity bits, the link ECC decoder and correction circuitry further configured to read the link ECC write data parity bits from unused data mask bits of the received write data during a normal write operation or from a mask write data byte of the received write data corresponding to an asserted data mask bit during a mask write operation of the received write data, and
memory ECC encoder circuitry configured for memory protection of the received write data during storage within the memory array according to memory ECC parity bits.

12. The memory sub-system of claim 11, in which the memory controller is configured to directly access a read path to read data from the memory device and configured to detect and correct random bit errors and/or memory link errors within the read data from the memory device at the ECC encoder/decoder of the memory controller.

13. The memory sub-system of claim 11, in which the memory device further comprises:
a read path coupled to the memory array, the read path comprising:
memory ECC decoder and correction circuitry configured for memory error detection and correction of read data from the memory array, and
link ECC encoder circuitry configured for link protection of the read data from the memory array.

14. The memory sub-system of claim 13, in which the memory ECC decoder and correction circuitry is configured to detect and correct memory errors of the read data within the memory array according to read ECC parity bits.

15. The memory sub-system of claim 13, in which the link ECC encoder circuitry is further configured to generate link ECC read data parity bits to protect the read data during transmission over the high speed serial memory link.

16. The memory sub-system of claim 13, in which the link ECC encoder circuitry is further configured to embed the link ECC read data parity bits within data mask bits during transmission of the read data over the high speed serial memory link.

17. The memory sub-system of claim 11 integrated into a mobile phone, a set top box, a music player, a video player, an entertainment unit, a navigation device, a computer, a hand-held personal communication systems (PCS) unit, a portable data unit, a fixed location data unit, a server computing system and/or a vehicle control system.

18. A memory device, comprising:
a memory array; and
a write path coupled to the memory array, the write path comprising:
means for detecting and correcting link errors of write data received over a high speed serial memory link according to link ECC write data parity bits;
means for reading the link ECC write data parity bits from unused data mask bits of the received write data during a normal write operation or from a mask write data byte of the received write data corresponding to an asserted data mask bit during a mask write operation of the received write data; and
means for protecting the write data during storage in the memory array.

19. The memory device of claim 18, further comprising:
a read path coupled to the memory array, the read path comprising:
means for detecting and correcting memory errors of the received write data during storage within the memory array; and
means for protecting data read from the memory array during transmission over the high speed serial memory link.

20. The memory device of claim 19, further comprising means for detecting and correcting memory errors of the received write data during storage within the memory array according to memory ECC parity bits.

21. The memory device of claim 19, further comprising means for generating link ECC read data parity bits to protect the read data during transmission over the high speed serial memory link.

22. The memory device of claim 21, further comprising means for embedding the link ECC read data parity bits within data mask bits of the read data during transmission of the read data over the high speed serial memory link.

23. The memory device of claim 18 integrated into a mobile phone, a set top box, a music player, a video player, an entertainment unit, a navigation device, a computer, a hand-held personal communication systems (PCS) unit, a portable data unit, a fixed location data unit, a server computing system and/or a vehicle control system.

* * * * *